US012563800B2

(12) United States Patent
Lin et al.

(10) Patent No.: US 12,563,800 B2
(45) Date of Patent: Feb. 24, 2026

(54) METHOD FOR FORMING OHMIC CONTACTS ON COMPOUND SEMICONDUCTOR DEVICES

(71) Applicant: UNITED MICROELECTRONICS CORP., Hsin-Chu (TW)

(72) Inventors: Da-Jun Lin, Kaohsiung (TW); Fu-Yu Tsai, Tainan (TW); Bin-Siang Tsai, Changhua County (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 594 days.

(21) Appl. No.: 17/837,054

(22) Filed: Jun. 10, 2022

(65) Prior Publication Data

US 2023/0369436 A1 Nov. 16, 2023

(30) Foreign Application Priority Data

May 10, 2022 (CN) .......................... 202210505651.0

(51) Int. Cl.
| | |
|---|---|
| *H10D 62/85* | (2025.01) |
| *H01L 21/285* | (2006.01) |
| *H10D 30/01* | (2025.01) |
| *H10D 30/47* | (2025.01) |
| *H10D 64/62* | (2025.01) |

(52) U.S. Cl.
CPC ....... *H10D 62/85* (2025.01); *H01L 21/28575* (2013.01); *H10D 30/015* (2025.01); *H10D 30/4755* (2025.01); *H10D 62/8503* (2025.01); *H10D 64/62* (2025.01)

(58) Field of Classification Search
CPC ........ H01L 21/28506; H01L 21/28575; H10D 62/85; H10D 62/8503; H10D 30/015; H10D 30/4755; H10D 64/62
See application file for complete search history.

(56) References Cited

U.S. PATENT DOCUMENTS

| | | | | |
|---|---|---|---|---|
| 9,721,889 | B1 * | 8/2017 | Niu | ................... H01L 21/76895 |
| 10,032,880 | B2 | 7/2018 | Constant | |
| 2013/0075748 | A1 * | 3/2013 | Bour | .................... H10D 62/854 |
| | | | | 257/E29.093 |
| 2016/0240646 | A1 * | 8/2016 | Chiu | .................. H10D 30/4755 |
| 2017/0077255 | A1 * | 3/2017 | Yao | ....................... H10D 62/824 |

(Continued)

FOREIGN PATENT DOCUMENTS

TW 202201581 A 1/2022

*Primary Examiner* — Matthew C Landau
*Assistant Examiner* — Halee Cramer
(74) *Attorney, Agent, or Firm* — Winston Hsu

(57) ABSTRACT

A method for forming ohmic contacts on a compound semiconductor device is disclosed. A channel layer is formed on a substrate. A barrier layer is formed on the channel layer. A passivation layer is formed on the barrier layer. A contact area is formed by etching through the passivation layer and the barrier layer. The channel layer is partially exposed at a bottom of the contact area. A sacrificial metallic layer is conformally deposited on the contact area. The sacrificial metallic layer is subjected to an annealing process, thereby forming a heavily doped region in the channel layer directly under the sacrificial metallic layer. The sacrificial metallic layer is removed to expose the heavily doped region. A metal silicide layer is formed on the heavily doped region.

17 Claims, 7 Drawing Sheets

(56) References Cited

U.S. PATENT DOCUMENTS

| | | | |
|---|---|---|---|
| 2019/0035634 A1* | 1/2019 | Adusumilli | H01L 21/3213 |
| 2020/0388701 A1* | 12/2020 | Hickman | H10D 64/411 |
| 2021/0202476 A1* | 7/2021 | Huang | H10D 84/0186 |
| 2022/0181159 A1* | 6/2022 | Posthuma | H01L 21/32135 |
| 2023/0282480 A1* | 9/2023 | Kim | H01J 37/3171 |
| | | | 438/522 |
| 2024/0332397 A1* | 10/2024 | Fiorenza | H10D 62/343 |

* cited by examiner

METHOD FOR FORMING OHMIC CONTACTS ON COMPOUND SEMICONDUCTOR DEVICES

BACKGROUND OF THE INVENTION

1. Field of the Invention

The present invention relates to the field of semiconductor technology, in particular to a method for forming an ohmic contact on a compound semiconductor device.

2. Description of the Prior Art

High electron mobility transistors (HEMTs) are known in the art. GaN HEMTs are widely used in high-frequency, high-power amplifier components due to high breakdown voltage, high saturation electron moving speed and high operation temperature.

In a typical HEMT, for example, a two-dimensional electron gas (2DEG) is generated at a semiconductor heterojunction. The 2DEG represents a very thin conduction layer of highly mobile and highly concentrated charge carriers free to move readily in the two dimensions of that conduction layer, but constrained from movement in a third dimension perpendicular to the conduction layer.

Low-resistance, stable contacts are critical for the performance and reliability of integrated circuits, and their preparation and characterization are major efforts in circuit fabrication.

SUMMARY OF THE INVENTION

It is one object of the present invention to provide a method for fabricating a compound semiconductor device having low-resistance and stable ohmic contact.

According to one aspect of the invention, a method for forming an ohmic contact on a compound semiconductor device is disclosed. A substrate is provided. A channel layer is formed on the substrate. A barrier layer is formed on the channel layer. A passivation layer is formed on the barrier layer. A contact area is formed by etching through the passivation layer and the barrier layer. The channel layer is partially exposed at a bottom of the contact area. A sacrificial metallic layer is conformally deposited on the contact area. The sacrificial metallic layer is subjected to an annealing process, thereby forming a heavily doped region in the channel layer directly under the sacrificial metallic layer. The sacrificial metallic layer is removed to expose the heavily doped region. A metal silicide layer is formed on the heavily doped region.

According to some embodiments, the sacrificial cap layer comprises a Ti layer and a TiN layer.

According to some embodiments, the Ti layer has a thickness of 500-1000 angstroms and the TiN layer has a thickness of less than or equal to 500 angstroms.

According to some embodiments, the heavily doped region is an $N^{++}$ region.

According to some embodiments, the sacrificial metallic layer is removed by performing a dry etching process.

According to some embodiments, a spacer comprising remainder of the sacrificial metallic layer is left on a sidewall of the passivation layer and a sidewall of the barrier layer.

According to some embodiments, the dry etching process comprises over-etching the channel layer by using $BCl_3$.

According to some embodiments, the heavily doped region is an $N^+$ region.

According to some embodiments, the sacrificial metallic layer is removed by performing a wet etching process.

According to some embodiments, the wet etching process comprises sulfuric acid peroxide mixture (SPM) cleaning.

According to some embodiments, the channel layer comprises GaN.

According to some embodiments, the channel layer is an un-doped GaN layer.

According to some embodiments, the barrier layer comprises AlGaN.

According to some embodiments, the method further comprises the step of forming two-dimensional electron gas at an interface between the channel layer and the barrier layer.

According to some embodiments, the method further comprises the steps of forming a buffer layer on the substrate; and forming the channel layer on the buffer layer, wherein the buffer layer has a band gap larger than that of the channel layer.

According to some embodiments, the buffer layer comprises AlN, AlGaN, or GaN.

According to some embodiments, the passivation layer comprises silicon nitride, silicon oxide, aluminum oxide, hafnium oxide, or aluminum nitride.

According to some embodiments, the substrate comprises SiC, Sapphire, Si, $Al_2O_3$, AlN, or GaN.

According to some embodiments, the channel layer and the barrier layer are epitaxially grown on the substrate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
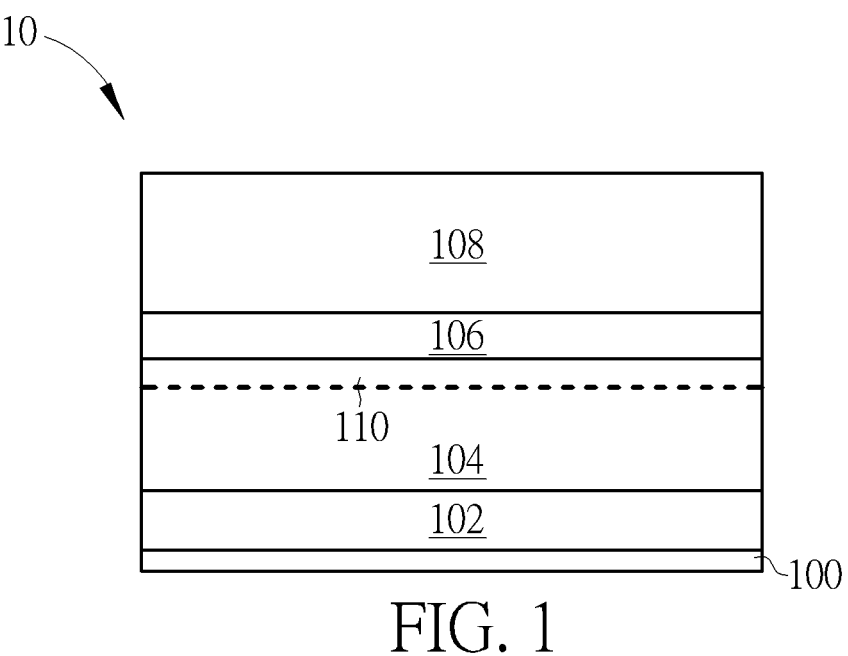
FIG. 1 to FIG. 7 are schematic diagrams illustrating a method for forming an ohmic contact on a compound semiconductor device according to an embodiment of the present invention.

Please refer to FIG. 1 to FIG. 7, which are schematic diagrams of a method for forming an ohmic contact on the compound semiconductor device 10 according to an embodiment of the present invention. As shown in FIG. 1, a substrate 100 is first provided. For example, the substrate 100 may include SiC, sapphire, Si, $Al_2O_3$, AlN or GaN, but is not limited thereto. Next, a buffer layer 102 may be formed on the substrate 100. For example, the buffer layer 102 may include AlN, AlGaN or GaN, but is not limited thereto.

Next, a channel layer 104 is formed on the buffer layer 102. The band gap of the buffer layer 102 is larger than the band gap of the channel layer 104. According to an embodiment of the present invention, the channel layer 104 may include GaN. According to another embodiment of the present invention, the channel layer 104 may be an undoped GaN layer. Next, a barrier layer 106 is formed on the channel layer 104. According to an embodiment of the present invention, the barrier layer 106 may include AlGaN, but is not limited thereto. According to an embodiment of the present invention, the channel layer 104 and the barrier layer 106 are epitaxially grown on the substrate 100.

Subsequently, a passivation layer 108 is formed on barrier layer 106. According to an embodiment of the present invention, the passivation layer 108 may include silicon nitride, silicon oxide, aluminum oxide, hafnium oxide or aluminum nitride, but is not limited thereto. According to an embodiment of the present invention, a two-dimensional electron gas (2DEG) 110 may be formed at the interface between the channel layer 104 and the barrier layer 106.

Figure 2:
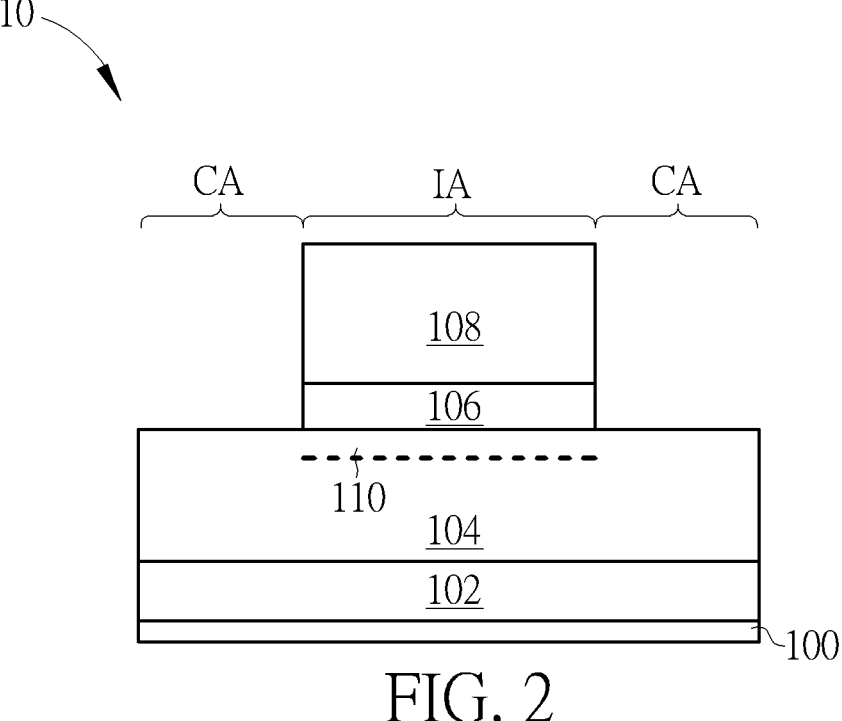

As shown in FIG. 2, a patterning process is then performed, and the passivation layer 108 and the barrier layer 106 are etched by using a dry etching process, thereby forming the contact area CA and the island area IA. According to an embodiment of the present invention, the channel layer 104 is partially exposed at the bottom of the contact area CA.

Figure 3:
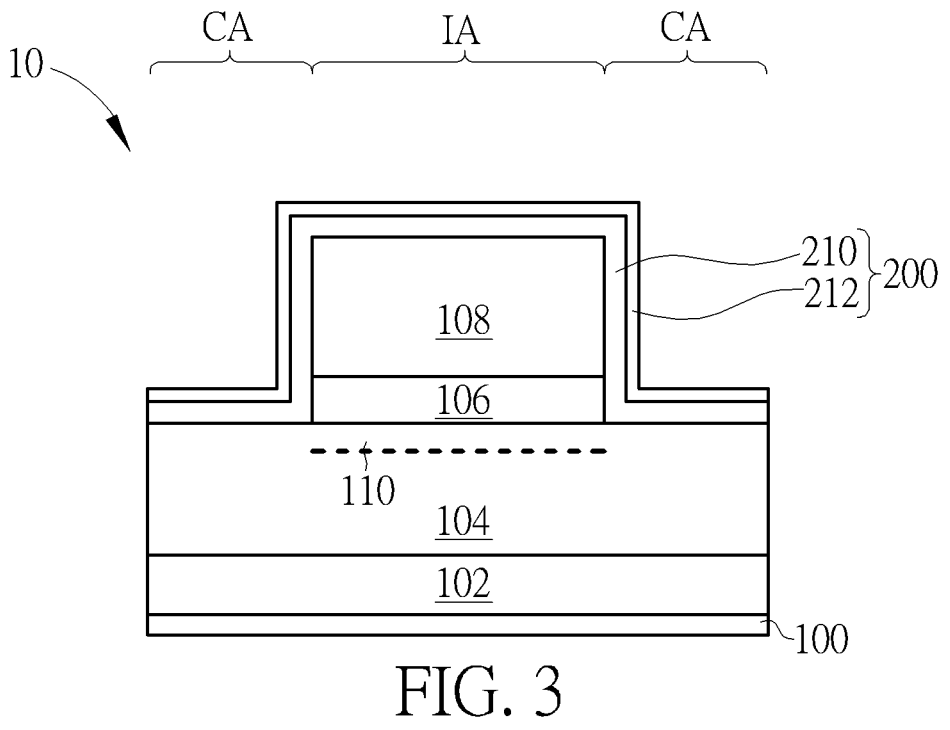

As shown in FIG. 3, next, a sacrificial metal layer 200 is conformally deposited on the island area IA and the contact area CA. According to an embodiment of the present invention, for example, the sacrificial metal layer 200 includes a Ti layer 210 and a TiN layer 212. According to an embodiment of the present invention, for example, the thickness of the Ti layer 210 is 500-1000 angstroms, and the thickness of the TiN layer 212 is less than or equal to 500 angstroms.

Figure 4:
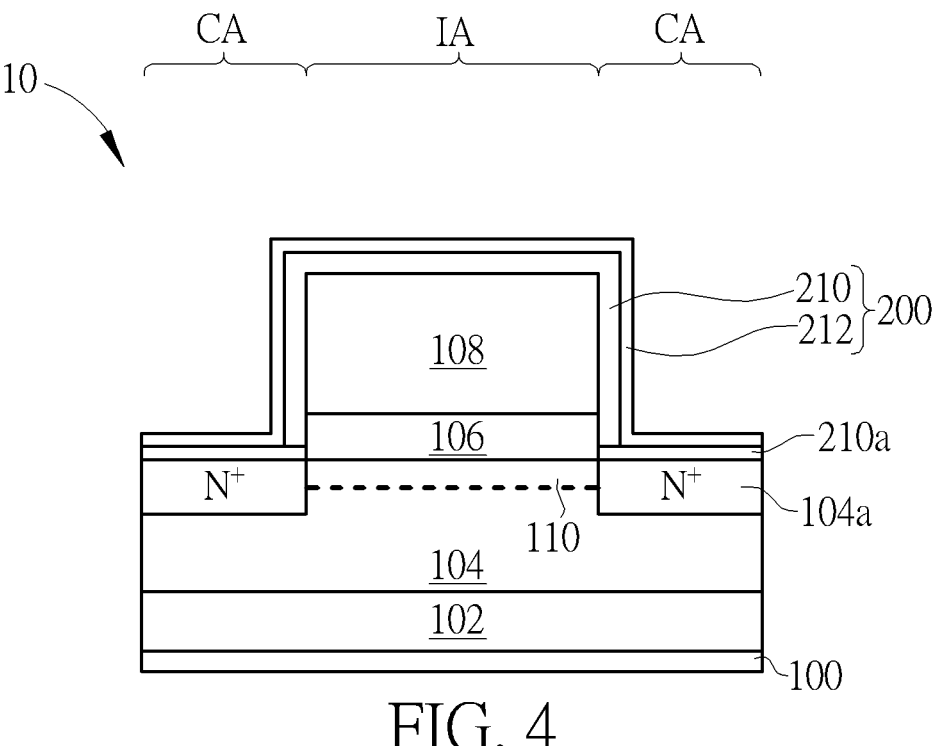

As shown in FIG. 4, an annealing process is performed on the sacrificial metal layer 210, so that the Ti layer 210 reacts with the channel layer 104 to form a TiN layer 210*a*, thereby forming an $N^+$ heavily doped region 104*a* in the channel layer 104 directly under the sacrificial metal layer 210 within the contact area CA.

Figure 5:
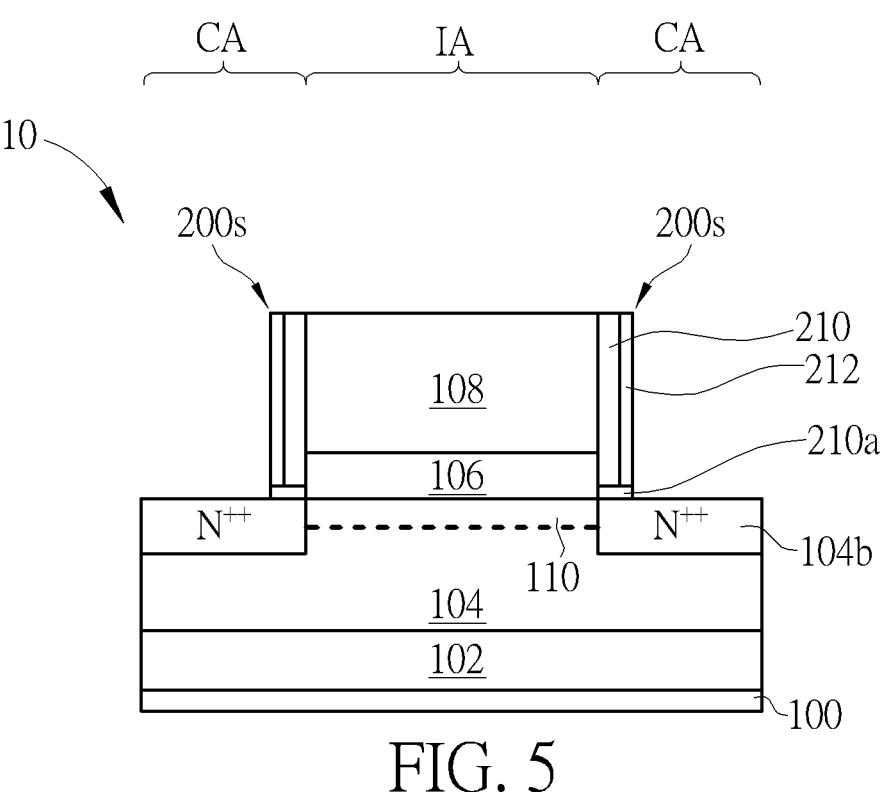

As shown in FIG. 5, the sacrificial metal layer 200 is then removed by performing a dry etching process to expose the $N^+$ heavily doped region 104*a*. According to an embodiment of the present invention, the dry etching process includes over-etching the channel layer 104 by using $BCl_3$ to increase the nitrogen vacancy (N vacancy) in the contact area CA, thereby forming an $N^{++}$ heavily doped region 104*b*. According to an embodiment of the present invention, spacers 200*s* including the remainder of the sacrificial metal layer 200 are left on the sidewalls of the passivation layer 108 and the sidewalls of the barrier layer 106.

According to another embodiment of the present invention, the etching parameters can be adjusted to completely remove the sacrificial metal layer 200 without forming spacers on the sidewalls of the passivation layer 108 and the sidewalls of the barrier layer 106.

Figure 6:
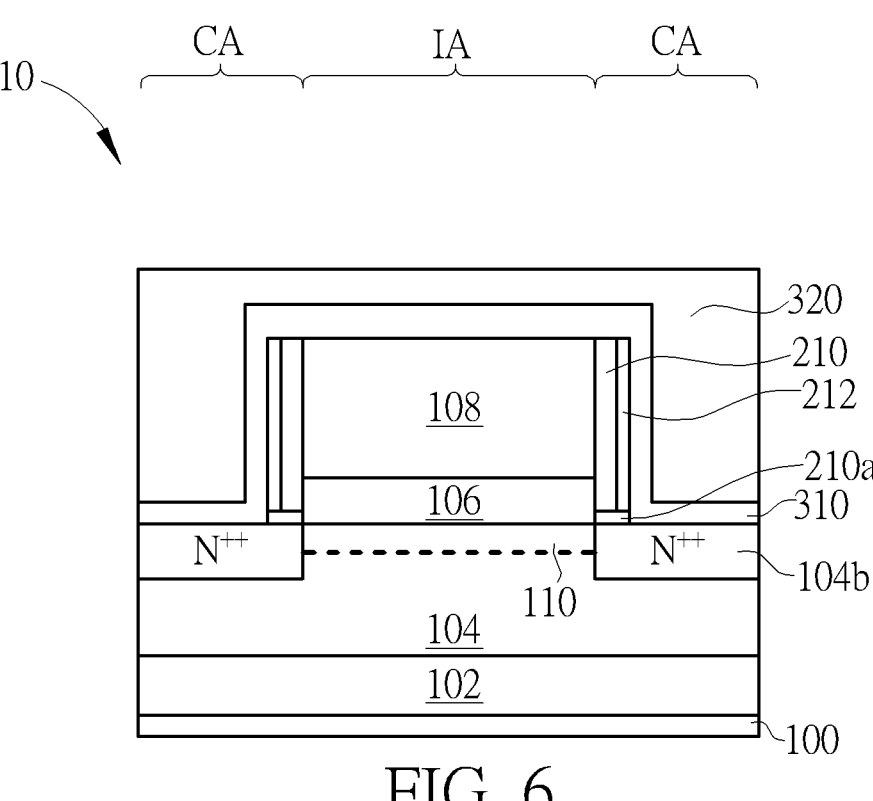

As shown in FIG. 6, next, a silicon layer 310 is conformally deposited, and then a metal layer 320, such as titanium or aluminum, is deposited on the silicon layer 310.

Figure 7:
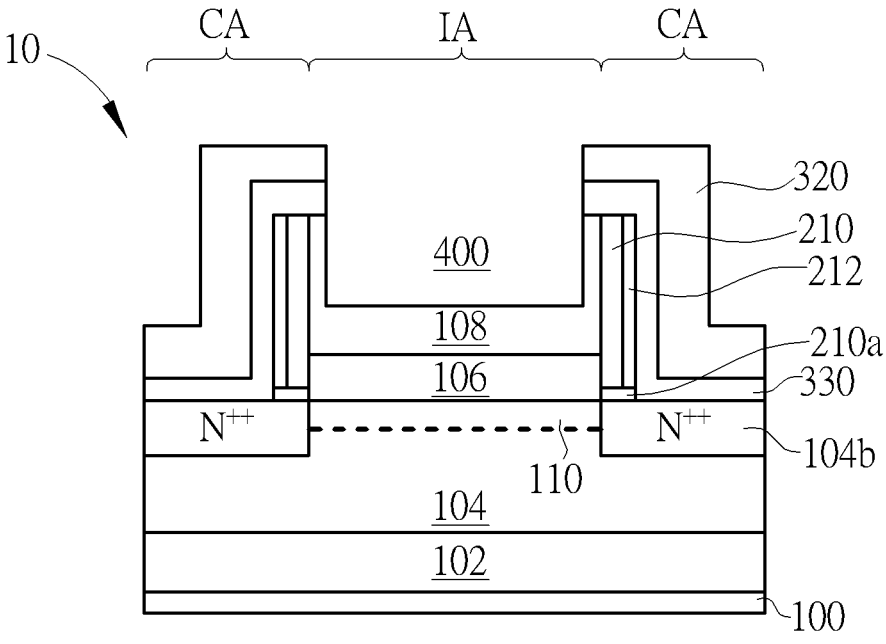

As shown in FIG. 7, an annealing process is then performed to make the silicon layer 310 react with the metal layer 320, thereby forming a metal silicide layer 330. The metal silicide layer 330 is formed on the $N^{++}$ heavily doped region 104*b*. Subsequently, the remaining metal layer 320 and the metal silicide layer 330 are patterned by a photolithography process and an etching process, and a recess 400 is formed in the passivation layer 108.

Subsequently, the contact fabrication process of the source electrode and the drain electrode and the fabrication process of the gate electrode can be continued. Since these steps are well-known techniques, they will not be described separately.

One advantage of the present invention is that: the Ti layer 210 of the sacrificial metal layer 200 and the channel layer 104 are reacted to form the TiN layer 210*a*, so that $N^+$ heavy doped region 104*a* is formed in the channel layer 104 directly under the sacrificial metal layer 210 within the contact area CA. In addition, by over-etching the channel layer 104 with $BCl_3$, the nitrogen vacancy (N vacancy) in the contact area CA is increased, thereby forming the $N^{++}$ heavily doped region 104*b*. A metal silicide layer 330 is formed on the $N^{++}$ heavily doped region 104*b*, thereby forming a low-resistance and stable ohmic contact.

Figure 8:
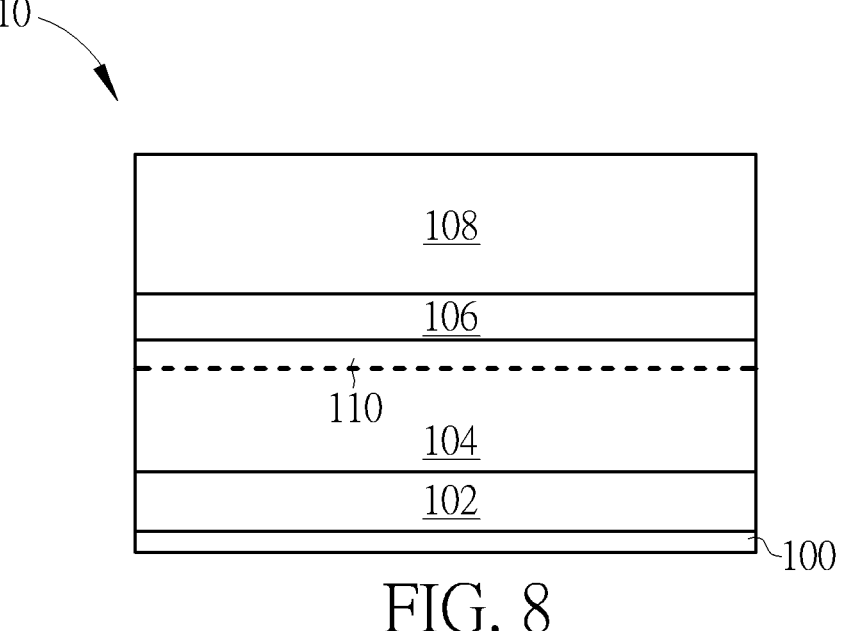
FIG. 8 to FIG. 14 are schematic diagrams illustrating a method for forming an ohmic contact on a compound semiconductor device according to another embodiment of the present invention.

Please refer to FIG. 8 to FIG. 14, which are schematic diagrams of a method for forming an ohmic contact on the compound semiconductor device 10 according to another embodiment of the present invention. As shown in FIG. 8, a substrate 100 is provided. For example, the substrate 100 may include SiC, sapphire, Si, $Al_2O_3$, AlN or GaN, but is not limited thereto. Next, the buffer layer 102 is formed on the substrate 100. For example, the buffer layer 102 may include AlN, AlGaN or GaN, but is not limited thereto.

Next, a channel layer 104 is formed on the buffer layer 102. The band gap of the buffer layer 102 is larger than the band gap of the channel layer 104. According to an embodiment of the present invention, the channel layer 104 may include GaN. According to an embodiment of the present invention, the channel layer 104 may be an undoped GaN layer. Next, a barrier layer 106 is formed on the channel layer 104. According to an embodiment of the present invention, the barrier layer 106 may include AlGaN, but is not limited thereto. According to an embodiment of the present invention, the channel layer 104 and the barrier layer 106 are epitaxially grown on the substrate 100.

Subsequently, a passivation layer 108 is formed on the barrier layer 106. According to an embodiment of the present invention, the passivation layer 108 may include silicon nitride, silicon oxide, aluminum oxide, hafnium oxide or aluminum nitride, but is not limited thereto. According to an embodiment of the present invention, a two-dimensional electron gas (2DEG) 110 may be formed at the interface of the channel layer 104 and the barrier layer 106.

Figure 9:
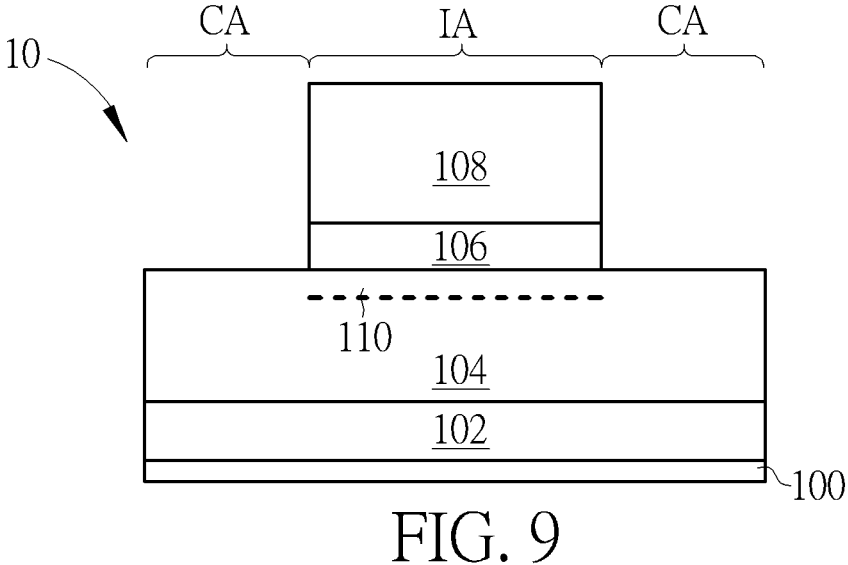

As shown in FIG. 9, a patterning process is then performed, and the passivation layer 108 and the barrier layer 106 are etched by using a dry etching process, thereby forming a contact area CA and an island area IA. According to an embodiment of the present invention, the channel layer 104 is partially exposed at the bottom of the contact area CA.

Figure 10:
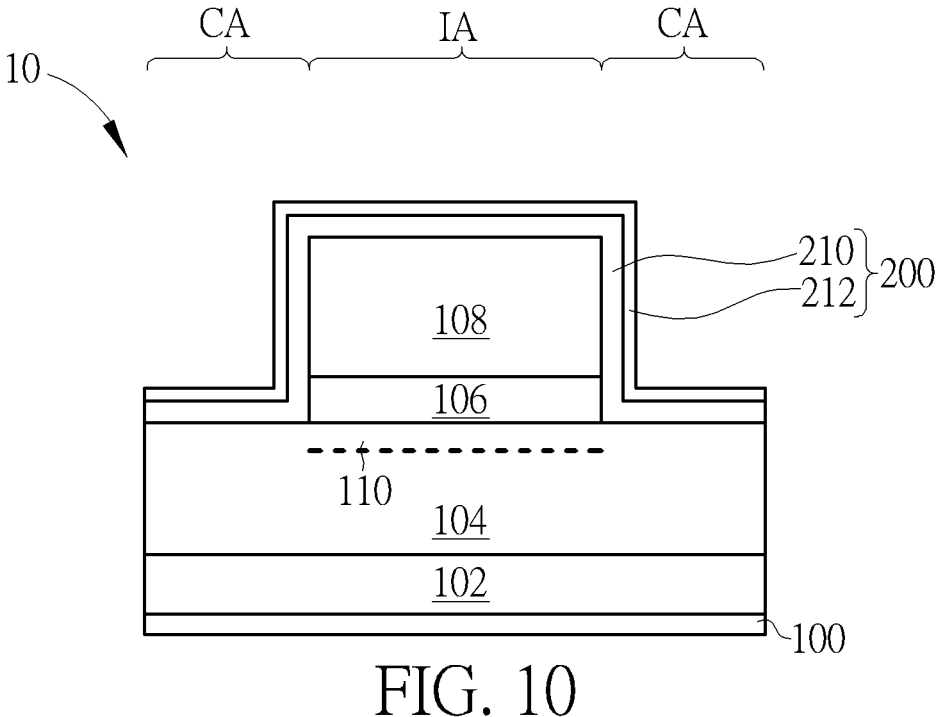

As shown in FIG. 10, next, a sacrificial metal layer 200 is conformally deposited on the island area IA and the contact area CA. According to an embodiment of the present invention, for example, the sacrificial metal layer 200 includes a Ti layer 210 and a TiN layer 212. According to an embodiment of the present invention, for example, the thickness of the Ti layer 210 is 500-1000 angstroms, and the thickness of the TiN layer 212 is less than or equal to 500 angstroms.

Figure 11:
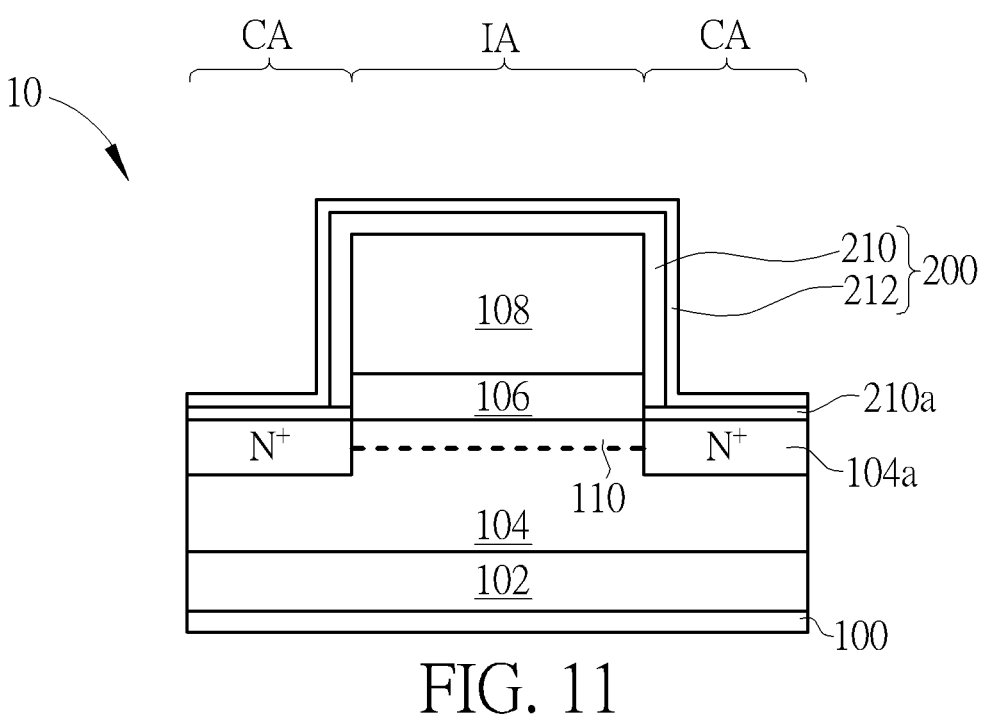

As shown in FIG. 11, an annealing process is performed on the sacrificial metal layer 210, so that the Ti layer 210 reacts with the channel layer 104 to form a TiN layer 210*a*, thereby forming an N⁺ heavily doped region 104*a* in the channel layer 104 directly under the sacrificial metal layer 210 within the contact area CA.

Figure 12:
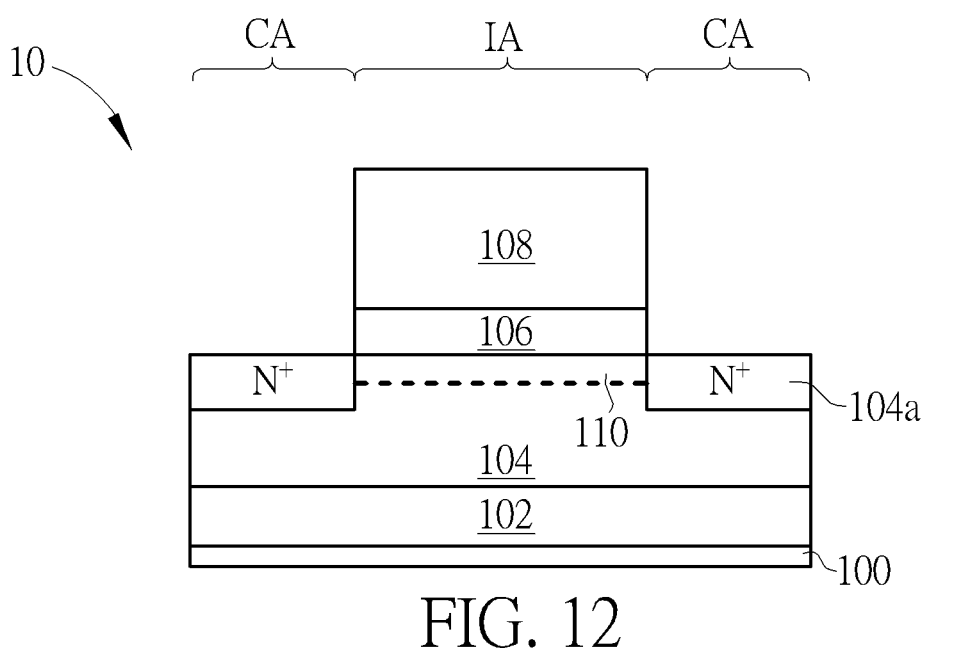

As shown in FIG. 12, next, the sacrificial metal layer 200 is removed by performing a wet etching process to expose the N⁺ heavily doped region 104*a*. According to an embodiment of the present invention, the wet etching process includes a sulfuric acid peroxide mixture (SPM) cleaning. According to an embodiment of the present invention, the wet etching process completely removes the sacrificial metal layer 200, thus leaving no spacers on the sidewalls of the passivation layer 108 and the sidewalls of the barrier layer 106.

Figure 13:
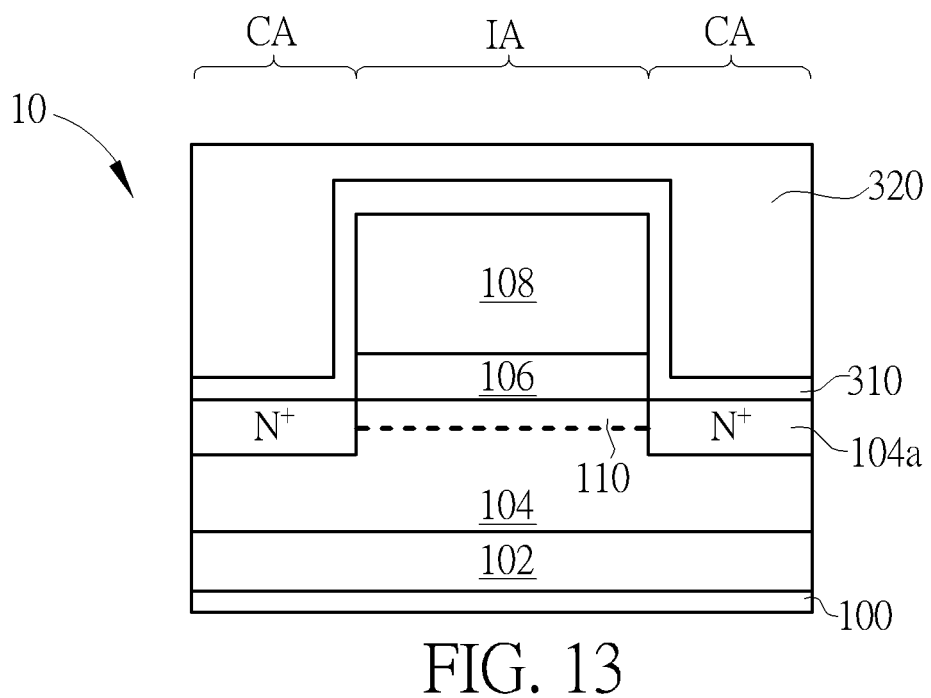

As shown in FIG. 13, next, a silicon layer 310 is conformally deposited, and then a metal layer 320, such as titanium or aluminum, is deposited on the silicon layer 310.

Figure 14:
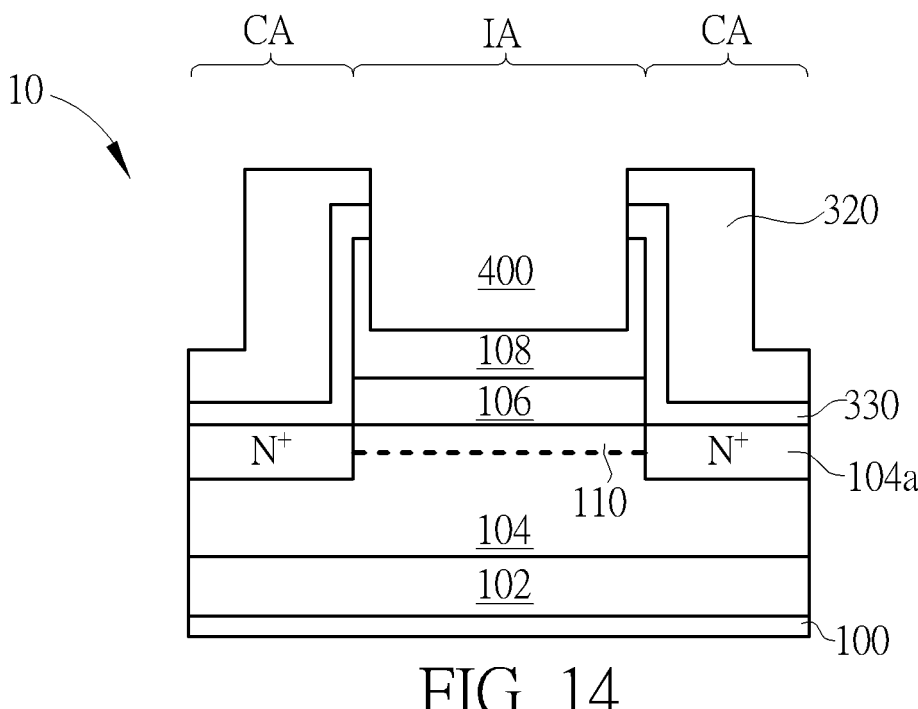

As shown in FIG. 14, an annealing process is then performed to make the silicon layer 310 react with the metal layer 320 to form a metal silicide layer 330. The metal silicide layer 330 is formed on the N⁺ heavily doped region 104*a*. Subsequently, the remaining metal layer 320 and the metal silicide layer 330 are patterned by a photolithography process and an etching process, and a recess 400 is formed in the passivation layer 108.

Subsequently, the contact fabrication process of the source electrode and the drain electrode and the fabrication process of the gate electrode can be continued. Since these steps are well-known techniques, they will not be described separately.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming an ohmic contact on a compound semiconductor device, comprising:

providing a substrate;

forming a channel layer on the substrate;

forming a barrier layer on the channel layer;

forming a passivation layer on the barrier layer;

forming a contact area by etching through the passivation layer and the barrier layer, wherein the channel layer is partially exposed at a bottom of the contact area, wherein a remainder of the barrier layer and the passivation layer constitutes an island area located next to the contact area;

conformally depositing a sacrificial metallic layer on the contact area and on a sidewall and a top surface of the remainder of the barrier layer and the passivation layer, wherein the sacrificial metallic layer comprises a Ti layer;

subjecting the sacrificial metallic layer to an annealing process, wherein the Ti layer reacts with the channel layer to form a TiN layer thereby forming a heavily doped region in the channel layer directly under the sacrificial metallic layer within the contact area;

removing the sacrificial metallic layer to expose the heavily doped region, wherein the sacrificial metallic layer is removed by performing a dry etching process, wherein the dry etching process comprises a step of increasing nitrogen vacancy in the contact area by over-etching the channel layer using BCl₃; and forming a metal silicide layer on the heavily doped region.

2. The method according to claim 1, wherein the sacrificial metallic layer further comprises another TiN layer on the Ti layer.

3. The method according to claim 2, wherein the Ti layer has a thickness of 500-1000 angstroms and the another TiN layer has a thickness of less than or equal to 500 angstroms.

4. The method according to claim 1, wherein the heavily doped region is an N⁺⁺ region.

5. The method according to claim 4, wherein a spacer comprising remainder of the sacrificial metallic layer is left on a sidewall of the passivation layer and a sidewall of the barrier layer.

6. The method according to claim 1, wherein the heavily doped region is an N⁺ region.

7. The method according to claim 6, wherein the sacrificial metallic layer is removed by performing a wet etching process.

8. The method according to claim 7, wherein the wet etching process comprises sulfuric acid peroxide mixture (SPM) cleaning.

9. The method according to claim 1, wherein the channel layer comprises GaN.

10. The method according to claim 1, wherein the channel layer is an un-doped GaN layer.

11. The method according to claim 1, wherein the barrier layer comprises AlGaN.

12. The method according to claim 1 further comprising:

forming two-dimensional electron gas at an interface between the channel layer and the barrier layer.

13. The method according to claim 1 further comprising:

forming a buffer layer on the substrate; and forming the channel layer on the buffer layer, wherein the buffer layer has a band gap larger than that of the channel layer.

14. The method according to claim 13, wherein the buffer layer comprises AlN, AlGaN, or GaN.

15. The method according to claim 1, wherein the passivation layer comprises silicon nitride, silicon oxide, aluminum oxide, hafnium oxide, or aluminum nitride.

16. The method according to claim 1, wherein the substrate comprises SiC, Sapphire, Si, Al₂O₃, AlN, or GaN.

17. The method according to claim 1, wherein the channel layer and the barrier layer are epitaxially grown on the substrate.

\* \* \* \* \*